(12) United States Patent
Nishikawa et al.

(10) Patent No.: US 7,271,476 B2
(45) Date of Patent: Sep. 18, 2007

(54) WIRING SUBSTRATE FOR MOUNTING SEMICONDUCTOR COMPONENTS

(75) Inventors: Hiroyuki Nishikawa, Shiga (JP);
Shigeo Tanahashi, Kyoto (JP);
Katsura Hayashi, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/928,915

(22) Filed: Aug. 27, 2004

(65) Prior Publication Data

US 2005/0087850 A1    Apr. 28, 2005

(30) Foreign Application Priority Data

Aug. 28, 2003 (JP) ............................. 2003-304518
Aug. 28, 2003 (JP) ............................. 2003-304519
Sep. 29, 2003 (JP) ............................. 2003-337504

(51) Int. Cl.
*H01L 23/06* (2006.01)
*H01L 23/02* (2006.01)
*H01L 23/48* (2006.01)

(52) U.S. Cl. ............. 257/684; 257/686; 257/700; 257/738; 257/777; 257/778

(58) Field of Classification Search ........ 257/684–686, 257/691, 692, 724, 737–739, 777, 778
See application file for complete search history.

(56) References Cited

U.S. PATENT DOCUMENTS

| 5,034,850 A | 7/1991 | Hernandez et al. ......... 361/306 |
| 5,973,928 A | 10/1999 | Blasi et al. ................. 361/760 |

FOREIGN PATENT DOCUMENTS

| EP | 1 041 631 | 10/2000 |
| JP | 2000-101012 | 4/2000 |
| JP | 2000-349225 | 12/2000 |
| JP | 2001-102512 | 4/2001 |
| JP | 2001-223298 | 8/2001 |
| JP | 2001-345234 | 12/2001 |

*Primary Examiner*—Hung Vu
(74) *Attorney, Agent, or Firm*—Hogan & Hartson LLP (57) ABSTRACT

There is disclosed a wiring board comprising a core substrate 110, a build-up layer 130a formed on at least one side of main surfaces the core substrate, wherein a cavity 120 for accommodating a chip-type decoupling capacitor 121 is formed in the build-up layer 130a. The capacitor 121 includes electrode terminals on an upper surface thereof that are directly connected to a semiconductor component, and electrode terminals on a back surface of the capacitor 121 is connected to a wiring conductor layer 132a on a bottom surface of the cavity 120. This structure enables decoupling capacitor and the semiconductor component 260 to be connected with low resistance and low inductance.

10 Claims, 7 Drawing Sheets

WIRING SUBSTRATE FOR MOUNTING SEMICONDUCTOR COMPONENTS

This application is based on applications Nos. JP2003-304518, JP2003-304519 and JP2003-337504 the content of which is incorporated hereinto by reference.

BACKGROUND OF THE INVENTION

1. Field of the Invention

The present invention relates to wiring boards for mounting semiconductor components such as semiconductor integrated circuit chips (LSI chips) used for information processing devices such as computers.

In particular, the present invention relates to a wiring board with a decoupling capacitor used as a power supply provided in the vicinity of a semiconductor component, which allows the semiconductor component to operate stably and speedily, and a semiconductor device comprising the wiring board and semiconductor component mounted thereon.

2. Description of the Related Art

Conventionally, in order to operate a semiconductor component speedily and stably, studies have been devoted to stabilizing supply potential and ground potential to the semiconductor component by disposing the so-called decoupling capacitor in the vicinity of the semiconductor component so as to stably supply power to the semiconductor component and suppress power supply noise.

As the wiring distance for electrically connecting the decoupling capacitor and semiconductor component lengthens, due to the resistance and inductance that the wiring has, it becomes difficult to maintain power supply potential and ground potential stably.

In order to dispose the decoupling capacitor in the nearest vicinity of the semiconductor component, there has been proposed a structure in which, for example, the wiring board is fabricated by a ceramic multilayer technique, and the power supply wiring and ground wiring stacked among the dielectric layers are arranged in a sheet-like manner so as to generate capacitance among them, and a decoupling capacitor is disposed inside the wiring board.

However, although the approach for forming a decoupling capacitor by utilizing conductive layers and dielectric layers allows the wiring distance to be shortened, because of small dielectric constant of the dielectric layers, it has the drawback that the capacitance is insufficient compared to when a chip capacitor is used.

Also, there is an existing method in which a chip capacitor is disposed on the back side of the semiconductor component-mounting area of the wiring board to shorten the wiring distance by wiring that penetrates the wiring board.

In this method in which electrical connection is made by the wiring that penetrates the wiring board, while capacitance is sufficient because of the use of the chip capacitor, the wiring distance is prolonged by the thickened wiring board and inductance of the wiring inside the wiring board becomes too great to be negligible.

In order to further shorten the wiring distance, there have been proposed structures including the following: a structure in which a chip capacitor is buried inside the wiring board; a structure in which a chip capacitor is embedded in a cavity formed in the surface of the wiring board; and further, a structure in which a chip capacitor is disposed in a gap between the wiring board and a semiconductor component mounted thereon.

However, when the structure in which the chip capacitor is buried inside the wiring board is employed, peeling, cracking or break due to difference in thermal expansion coefficient between the buried chip capacitor and the material of the wiring board around the chip capacitor, and break due to clearance caused by insufficient machining accuracy on the wiring board and chip capacitor would occur.

Also, when the structure in which the chip capacitor is embedded in the cavity formed on the surface of the wiring board, because the bottom surface of the cavity for embedding the chip capacitor reaches inside the wiring board, the structure does not allow the capacitor to directly connect to a conductive wiring layer on the surface of the wiring board, and the connection is made via a conductive wiring layer on the back side of the wiring board. As a result, the wiring distance lengthens.

Although the method in which a chip capacitor is disposed in a clearance between the wiring board and a semiconductor component allows short wiring distance and high mounting accuracy, space for inserting the chip capacitor between the wiring board and the semiconductor component is necessary. The distance of this needs to be at least greater than the thickness of the chip capacitor, which is considerably large as compared to the height of a solder bump in the currently mainstream flip-chip mounting. Thus, realistically, inserting a chip capacitor is difficult, and this method can be applied to only limited applications that permit a large bump pitch.

It is an object of the present invention to provide a wiring board and a semiconductor device capable of effectively and stably supplying power and suppressing power supply noise that are necessary for stably operating semiconductor components.

BRIEF SUMMARY OF THE INVENTION

A wiring board according to the present invention comprises a core substrate, a build-up layer formed on at least one side of main surfaces of the core substrate, which comprises wiring conductor layers and insulation layers alternately stacked therein, a chip-type decoupling capacitor disposed within a cavity that is formed in the build-up layer, the capacitor having electrode terminals on an upper surface thereof and a connection portion on a back surface thereof that is connected to one of the wiring conductor layers on a bottom surface of the cavity.

A semiconductor device according to the present invention comprises the wiring board and a semiconductor component mounted thereon.

The wiring board and semiconductor device with this structure have the capacitor accommodated in the cavity and allow the electrode terminals on the upper surface of the capacitor to be directly connected to the semiconductor component mounted on the wiring board, which enables the decoupling capacitor to be connected to a semiconductor component with low resistance and low inductance. Accordingly, rapid charge transfer between the capacitor and semiconductor component is enabled, and malfunctions of the semiconductor component due to instability of power supply voltage can be prevented. In addition, power supply noise can be effectively suppressed.

When the upper end of the electrode terminals on the upper surface of the capacitor is made flush with the upper end of the installation electrode terminals for mounting the semiconductor component provided on the build-up layer, the semiconductor component and the capacitor can be directly connected only by mounting the semiconductor component on the wiring board.

When the connection portion comprises electrode terminals provided on the back surface of the capacitor, the connection between the capacitor and the wiring board can also be made with low resistance and low inductance, allowing rapid charge transfer from the power supply to the capacitor. As a result, malfunctions of the semiconductor component due to instability of the power supply voltage can be prevented.

There is also a structure in which no electrode terminals are present on the back surface of the capacitor, and the back surface of the capacitor and the bottom surface of the cavity are connected by an adhesive layer.

In cases where the adhesive layer is employed, it is preferable that the adhesive layer comprises a material that melts by heating. This is because when the semiconductor component is mounted on the wiring board, the adhesive layer is melted by heat, enabling self-alignment between the capacitor and the semiconductor component. Accordingly, even if the machining accuracy on the capacitor is low, required positioning accuracy with respect to the semiconductor component can be secured and occurrence of contact failure of the capacitor can be prevented. In addition, since there is no need for jigs for positioning from outside, the mounting cost can be reduced. Furthermore, even if the thermal expansion coefficient of the capacitor embedded in the cavity and that of the build-up layer around the capacitor differ, peeling, cracking or break does not occur, and break or the like caused by insufficient machining accuracy on the wiring board and capacitor does not occur.

In order to ensure the self-alignment, the melting point of the foregoing material is preferably lower than that of the metal material used for mounting the semiconductor component on the wiring board.

Alternatively, the adhesive layer may comprise a material that disappears by heating. This is because self-alignment between the capacitor and the semiconductor component is accomplished by disappearance of the adhesion layer caused by heat.

The foregoing material preferably has a boiling point lower than the melting point of the metal material used for mounting the semiconductor component on the wiring board.

When the adhesive layer disappears, a space is generated between the back surface of the capacitor and the wiring conductor layer on the bottom surface of the cavity in the semiconductor device according to the present invention. The space is caused to be generated by the disappearance of the adhesive layer that has been present between the back surface of the capacitor and the wiring conductor layer in the bottom surface of the cavity due to heating.

A wiring board according to the present invention further comprises a surface wiring layer for electrically connecting the electrode terminals of the capacitor to the wiring conductor layer of the build-up layer, the surface wiring layer comprising wiring conductor layers and insulation layers alternately stacked therein and installation electrode terminals for mounting the semiconductor component provided at a position above the capacitor, and a semiconductor device according to the present invention comprises the wiring board with the foregoing structure on which a semiconductor component is mounted.

The wiring board and the semiconductor component of the structure above are arranged such that the capacitor is accommodated in the cavity of the build-up layer through the surface wiring layer which is provided on the upper surfaces of the build-up layer and the capacitor, and the semiconductor component is mounted on a position immediately above the capacitor in the surface wiring layer. Accordingly, the electrode terminals of the capacitor can be connected to the semiconductor component mounted on the surface wiring layer through the wiring conductor layers in the surface wiring layer in a short distance. This enables the capacitor and the semiconductor component to be connected with low resistance and low inductance. In addition, the connection between the capacitor and the wiring board can be made through the wiring layers in the surface wiring layer in a short distance. As a result, charge transfer from the power supply through the capacitor to the semiconductor component can be accomplished rapidly, so that malfunctions of the semiconductor component due to instability of the power supply can be prevented. Moreover, even if the thermal expansion coefficient of the capacitor embedded in the cavity and that of the build-up layer around the capacitor differ, peeling, cracking or break does not occur, and break or the like caused by insufficient machining accuracy on the wiring board and capacitor does not occur.

DETAILED DESCRIPTION OF THE INVENTION

Hereinafter, specific embodiments of the present invention will be described in detail with reference to schematically illustrated drawings.

Figure 1:
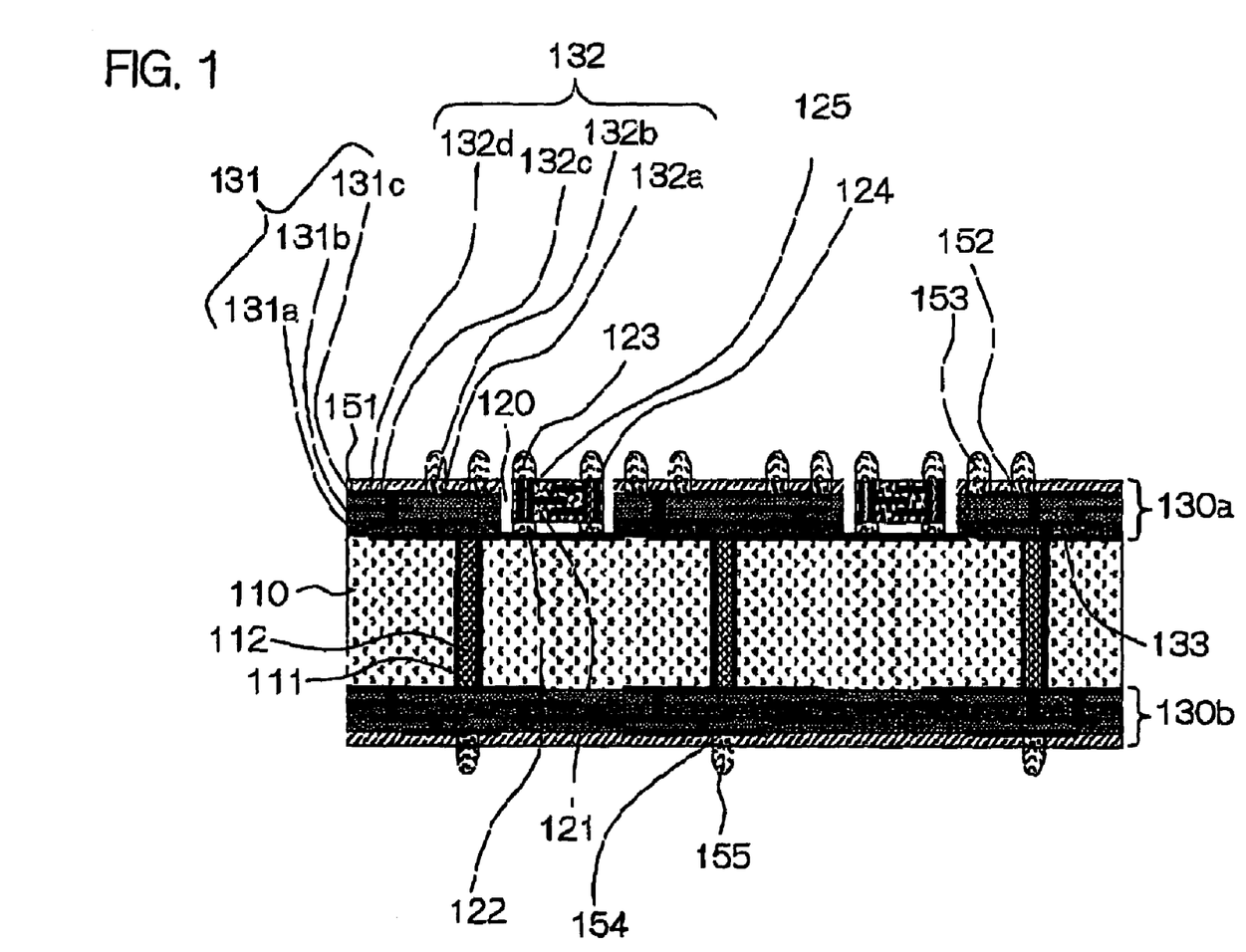
FIG. 1 is a cross-sectional view of a wiring board according to the present invention in which cavities 120 are formed in a build-up layer 130a, and chip-type decoupling capacitors 121 are accommodated in the cavities 120.
Figure 2:
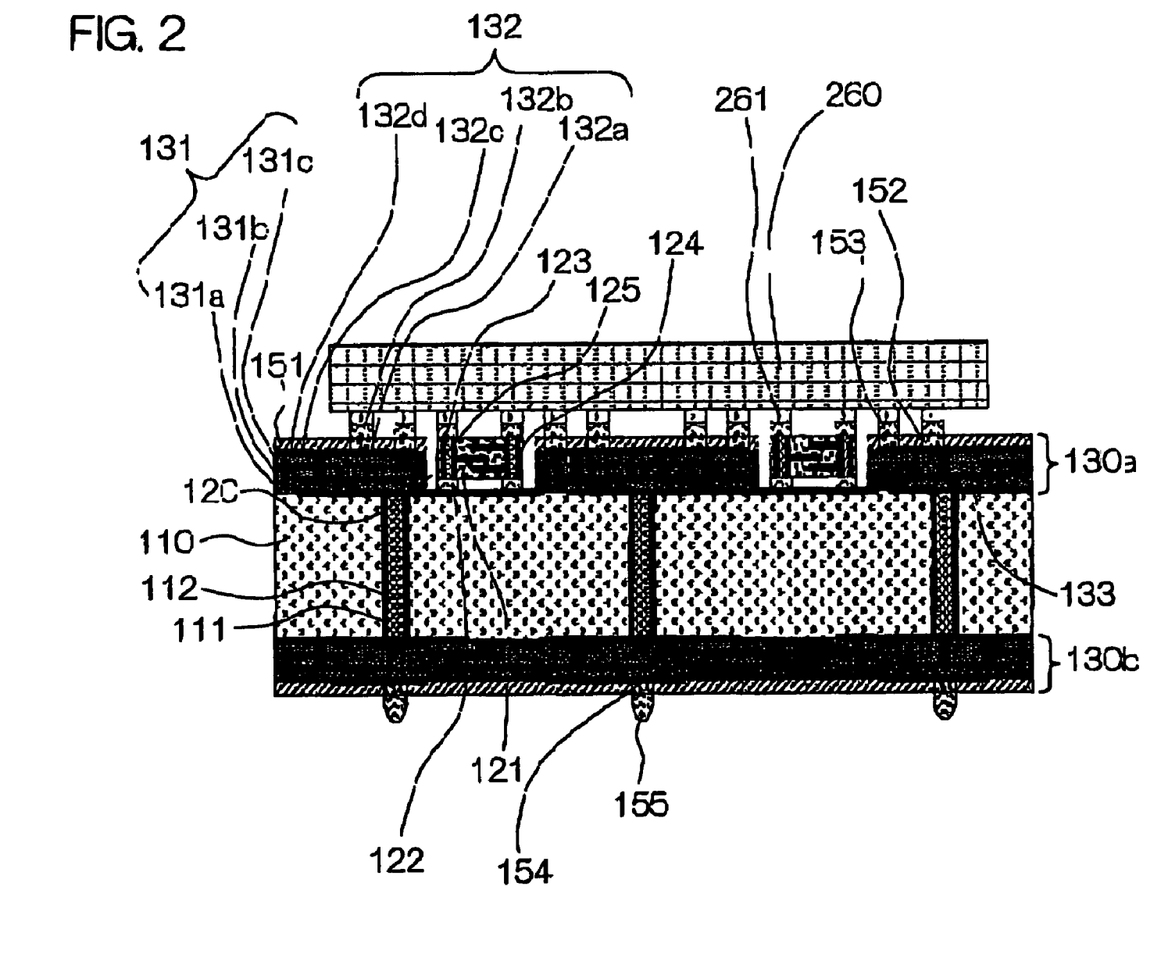
FIG. 2 is a cross-sectional view of a semiconductor device fabricated by mounting a semiconductor integrated circuit chip 260 on a wiring board according to the present invention.
Figure 3:
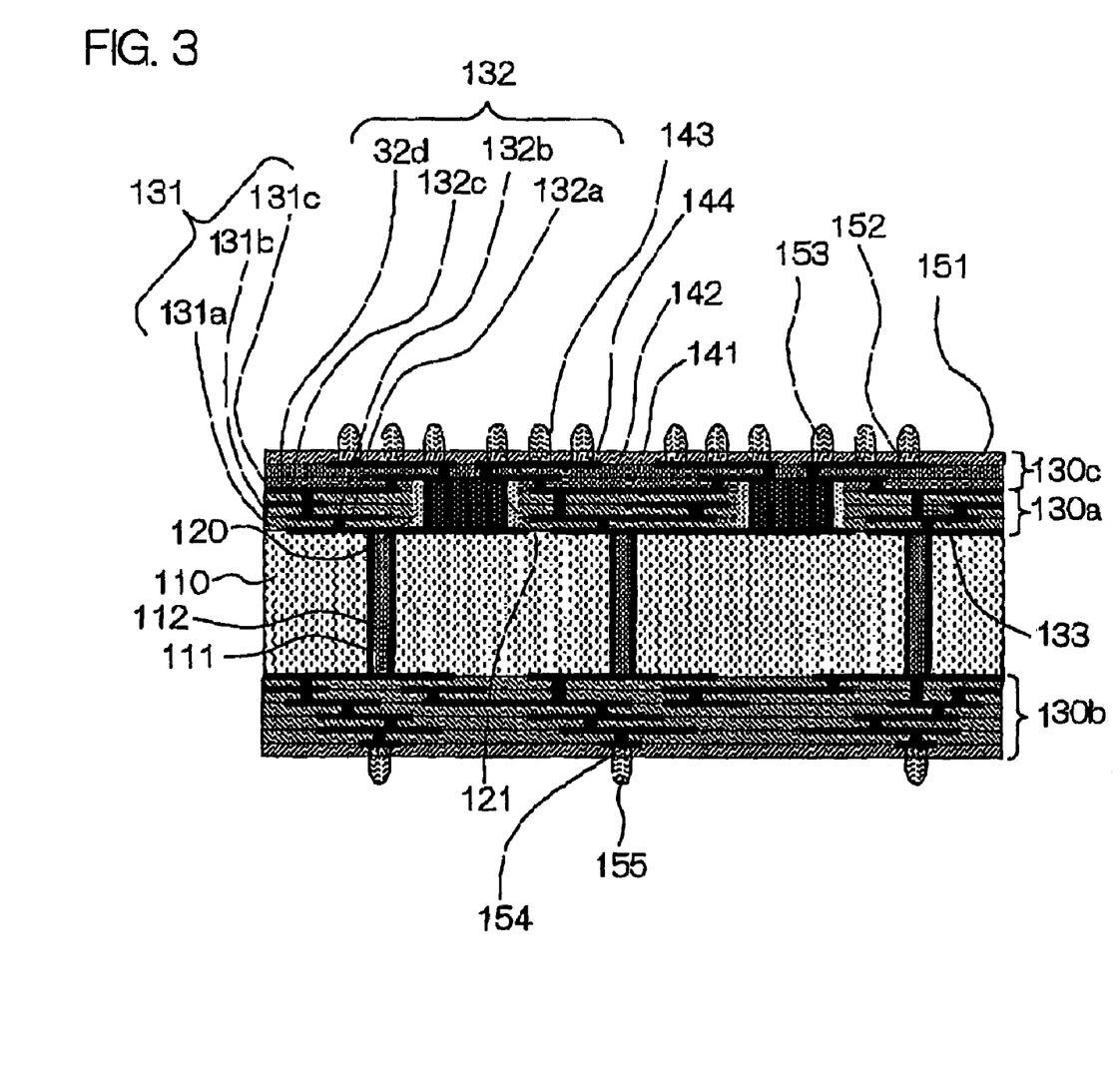
FIG. 3 is a cross-sectional view of a wiring board in which a surface wiring layer 130c is provided on a build-up layer 130a and decoupling capacitors 121.
Figure 4:
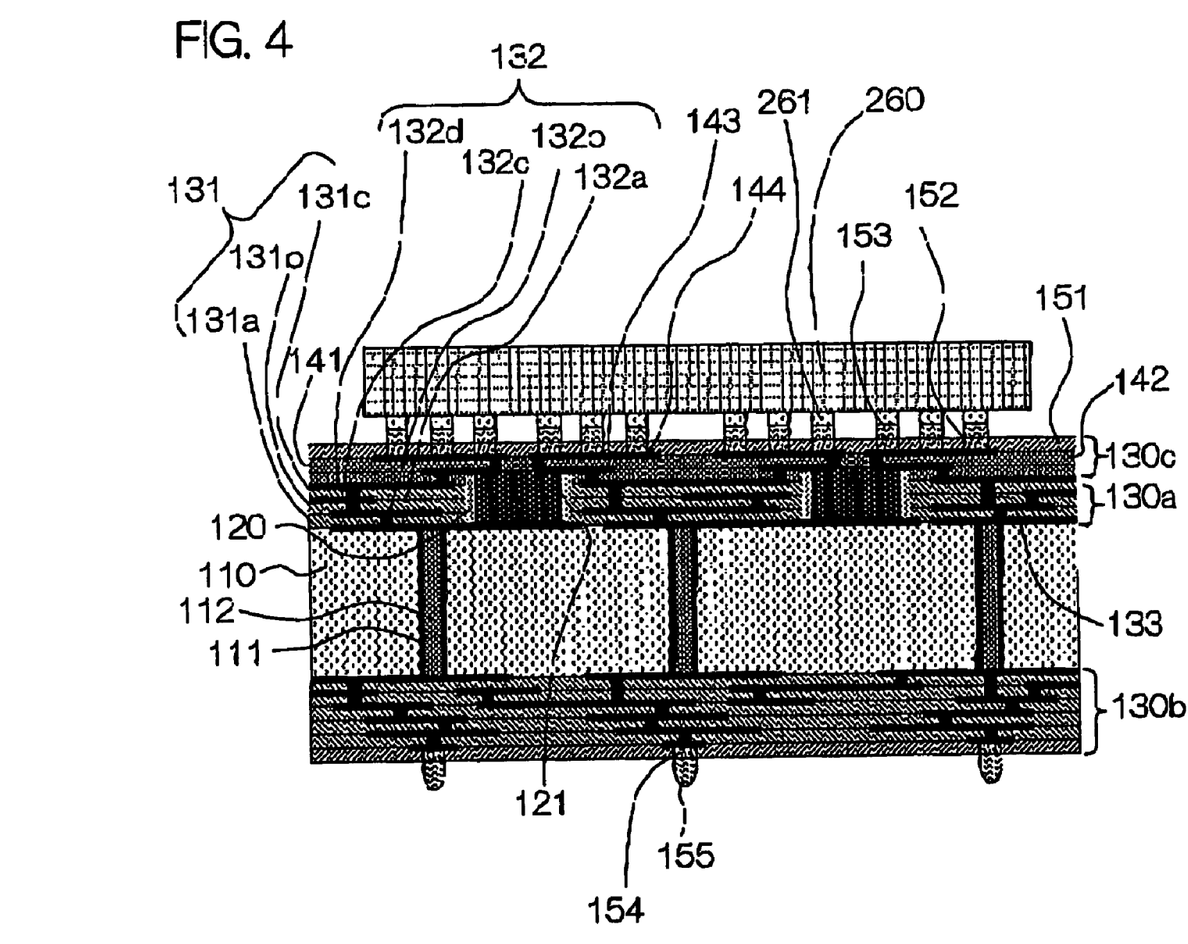
FIG. 4 is a cross-sectional view of a semiconductor device fabricated by mounting a semiconductor integrated circuit chip 260 on the wiring board in FIG. 3.
Figure 5:
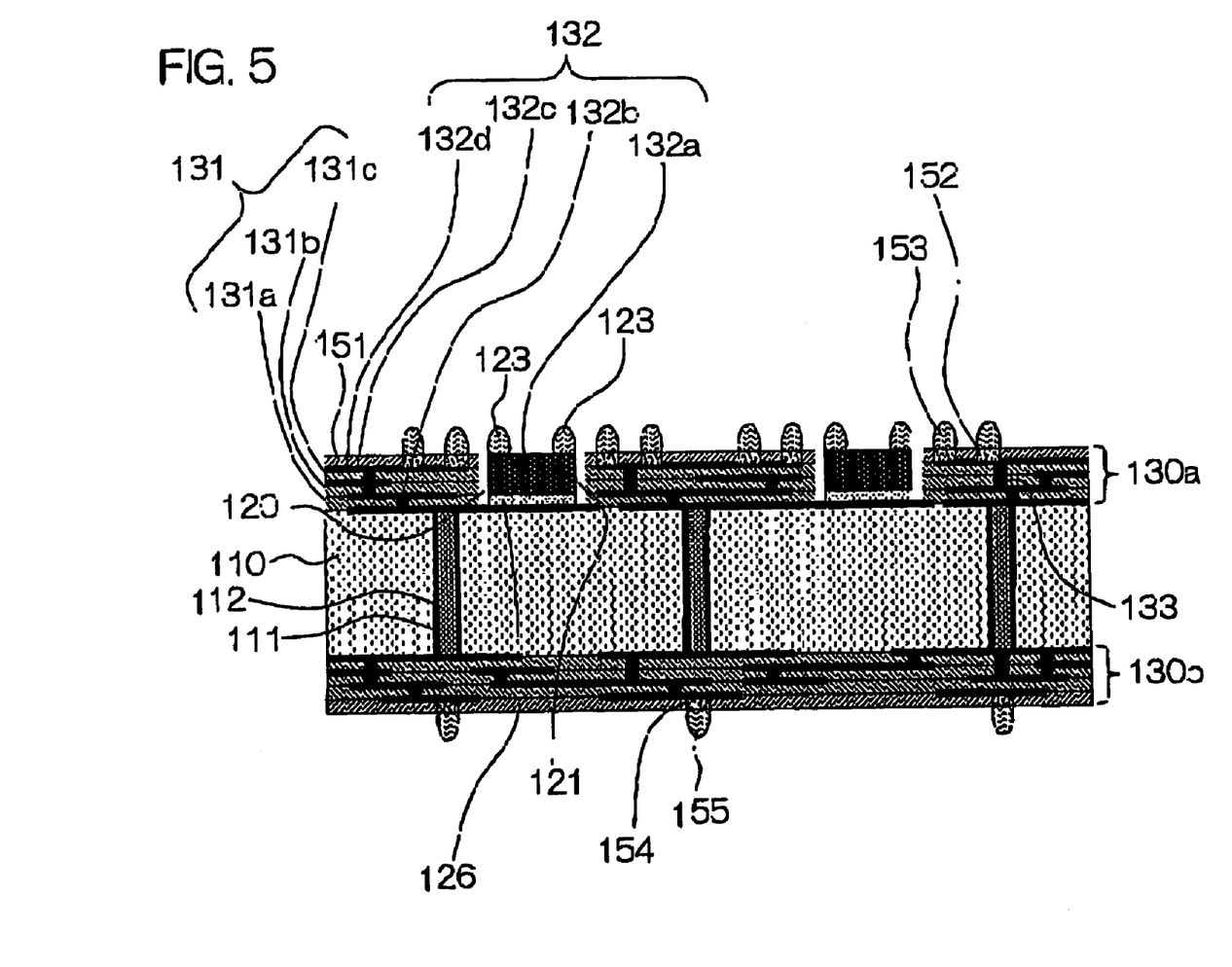
FIG. 5 is a cross-sectional view of a wiring board in which cavities 120 are formed in a build-up layer 130a, and decoupling capacitors 121 are provided in the cavities 120 through an adhesive layer 126 that is melted by heating.
Figure 6:
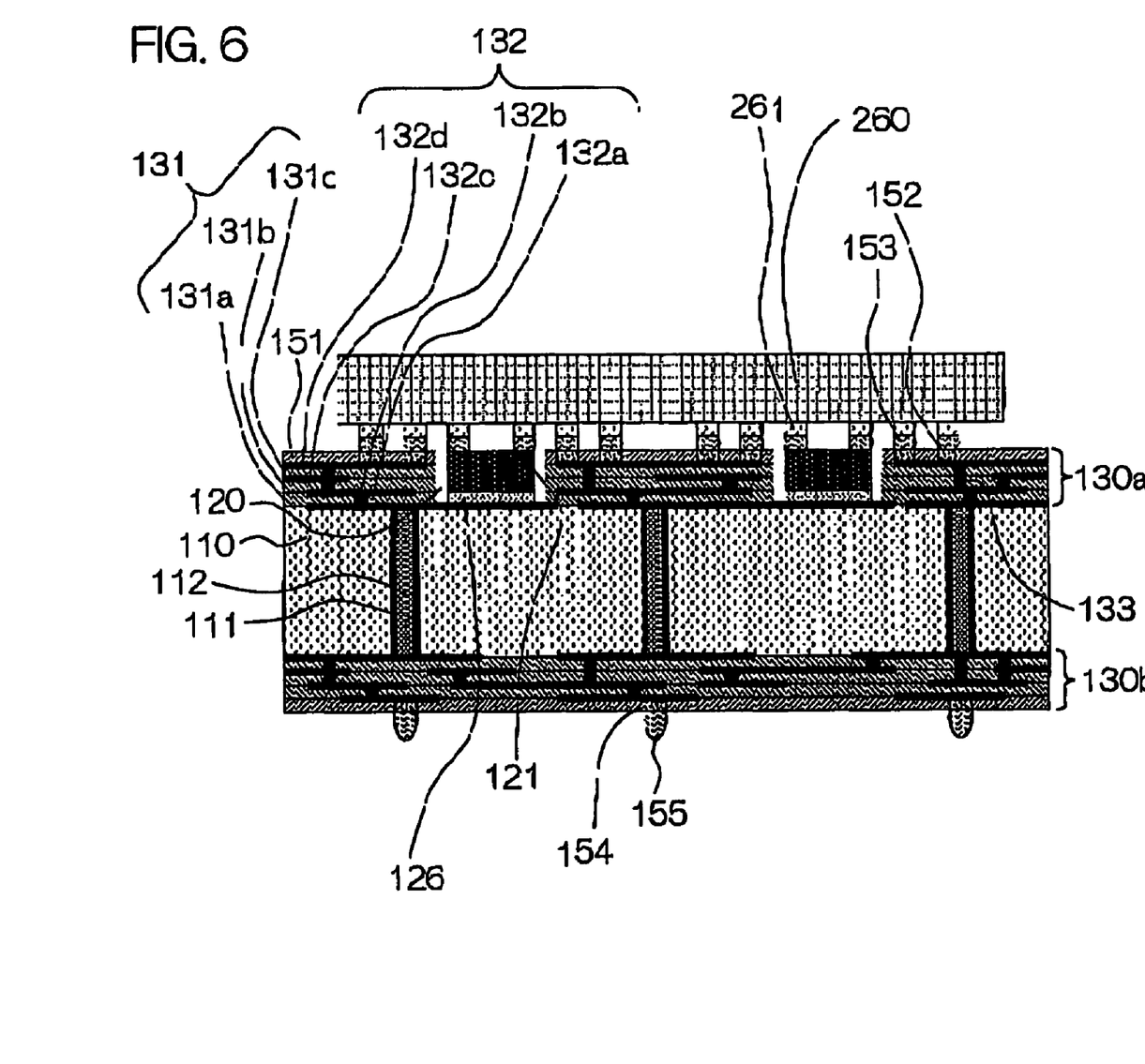
FIG. 6 shows a semiconductor device in which a semiconductor integrated circuit chip 260 is mounted on the upper surface of the build-up layer 130a and decoupling capacitors 121 in FIG. 5.

Cross-sectional views of semiconductor wiring boards (hereinafter simply referred to as "wiring board") provided with a capacitor of the present invention are shown in FIGS. 1, 3, and 5. Cross-sectional views of semiconductor components with a semiconductor integrated circuit chip on a wiring board are shown in FIGS. 2, 4 and 6. To avoid repetitive explanations, like components in different drawings are designated by the same reference symbols.

The wiring board shown in FIG. 1 comprises a core substrate 110 serving as base and a build-up layer 130a including wiring conductor layers and insulator layers alternately stacked thereon.

The build-up layer 130a is formed with cavities 120 on whose bottom surfaces decoupling capacitors (hereinafter, simply referred to as "capacitor") 121 are disposed. The capacitor 121 is a thin and flat chip provided with electrode terminals to be connected to a semiconductor integrated circuit chip on its top surface, and electrode terminals to be connected to the build-up layer 130a on its back surface.

The semiconductor component shown in FIG. 2 comprises the wiring board shown in FIG. 1, and a semiconductor integrated circuit chip 260 is placed on the electrode terminals on the top surfaces of the capacitors 121 and the build-up layer 130a, in which the semiconductor integrated circuit chip 260 is electrically connected to the capacitors 121.

As shown in FIG. 1, the wiring board according to the present invention comprises a core substrate 110, a build-up layer 130a formed on the surface side of the wiring board, and a build-up layer 130b formed on the back side of the wiring board. The build-up layer 130a on the surface side of the wiring board wiring includes conductor lines 132 (132a, 132b, 132c, 132d) constituting a first wiring conductor and interlayer insulation layer 131 (131a, 131b, 131c). The build-up layer 130b on the back side of the wiring board has a construction similar to that of the build-up layer 130a on the surface side of the wiring board. While the dielectric layers and electrode layers of the build-up layers 130a and 130b are drawn as they consist of 3-4 layers in FIG. 1, actually the number of these layers is greater. In the build-up layer 130a on the surface side of the wiring board, the cavities 120 for accommodating the capacitors 121 are formed.

The material for the core substrate 110 may be an inorganic material such as ceramics, AlN or the like, or a resin material generally used for printed wiring boards including glass epoxy resin-impregnated base material, phenol resin-impregnated base material or the like. The material for the interlayer insulation layers 131 may be a thermosetting resin such as epoxy-based resin, thermoplastic resin, photosensitive resin, a composite of thermosetting resin and thermoplastic resin, a composite of photosensitive resin and thermoplastic resin or the like.

As the material for the wiring conductor layer 132, commonly used conductor materials such as Cu, Al, Ni—Cu alloys, Cu—Al alloys may be used. The capacitor 121 comprises a plurality of dielectric layers and electrode layers interposed among the dielectric layers. Through-holes 124 penetrating through the main body of the capacitor 121 are formed in the direction perpendicular to the main surfaces of the dielectric layers and electrode layers. In the interior surface of the through holes 124, through hole conductors 125 are formed. Electrode terminals drawn from both end faces of the through-hole conductors 125 are each formed in the main surface on one side (upper main surface) and in the main surface of the other side (lower main surface).

Meanwhile, although FIG. 1 illustrates the capacitor 121 having three to four dielectric layers and electrode layers, actually, the number of these layers is greater than this.

The capacitor 121 is disposed so that the upper main surface faces the opening (upper side) and the lower main surface faces the bottom surface of the cavity 120.

Via hole conductors 133 penetrating the interlayer insulation layer 131 are formed in the interlayer insulation layer 131 of the build-up layer 130a, and the upper and lower wiring conductor layers 132 are electrically connected through the via hole conductors. A solder resist layer 151 comprising an insulator is formed on the wiring conductor layer 132 that is formed in an upper most portion of the build-up layer 130a. The solder resist layer 151 is formed with small apertures, in which electrode terminals 152 connected to the wiring conductor layer 132d are buried.

Solder balls 123 used for mounting a semiconductor integrated circuit chip 260 are formed on the electrode terminals in the upper main surface of the body of the capacitor 121, and solder pads 122 used for connection to the wiring conductor layer 132a in the bottom surface of the cavity is formed on the electrode terminals in the lower main surface.

Solder balls 153 serving as a connection portion for mounting the semiconductor integrated circuit chip 260 are formed on electrode terminals 152 in the build-up layer 130a.

In the wiring board, also on the opposite side of the surface on which the semiconductor integrated circuit chip 260 is mounted, the build-up layer 130b is provided as mentioned above.

The build-up layer 130b is connected to the build-up layer 130a through interior through-hole wiring layers 111 formed in the core substrate 110. Electrode terminals 154 formed in the build-up layer 130b are electrically connected to a motherboard that is not shown through solder balls 155 serving as a connection portion.

In the wiring board of the present invention, the capacitor 121 is disposed within the cavity 120, in which the bottom area of the cavity 120 is made larger than the cross section area of the capacitor 121 to be accommodated therein. This is because the machining accuracy for the cavities 120 is lower than the positioning accuracy for mounting the semiconductor integrated circuit chip 260, and the position of the capacitor 121 needs to be adjusted according to the wiring pattern of the wiring conductor layer 132a on the bottom surface of the cavity 120.

The depth of the cavity 120 is determined according to the thickness of the capacitor 121 to be accommodated therein. The depth of the cavity 120 is preferably determined so that the upper main surface of the capacitor 121 and the upper main surface of the solder resist layer 151 (the upper end surface of the electrode terminals 152 in the build-up layer 130a) are flush with each other.

Meanwhile, the wiring board described so far may be embodied as a wiring board in which no electrode terminals are present on the lower main surface of the body of the capacitor 121. In such a case, there are only electrode terminals of the capacitor 121 that are connected to electrode terminals of the semiconductor integrated circuit chip 260. In such a case, the adhesive used for bonding the back surface of the capacitor and the bottom surface of the cavity 120 together is preferably of thermoplastic nature that permits self-alignment during the mounting of a semiconductor component on the wiring board.

FIG. 2 is a cross-sectional view of a semiconductor device fabricated by mounting a semiconductor integrated circuit chip on a wiring board according to the present invention.

Electrode terminals 261 provided on the back surface of a semiconductor integrated circuit chip 260 are connected to electrode terminals 152 of the wiring board through solder balls 153 in the wiring board according to the present invention. The electrode terminals 261 provided on the back surface of the semiconductor integrated circuit chip 260 are electrically connected to electrode terminals of capacitors 121 through solder balls 123. The capacitors 121 are connected to a wiring conductor layer 132a on the bottom surface of the cavities 120 through the foregoing solder pads 122.

In the semiconductor device of the present invention described above, the electrode terminals of the capacitors 121 can be directly connected to the semiconductor integrated circuit chip 260 through the solder pads 122. As a result, the resistance of the connection portions can be suppressed to a low level. In addition, because no routing is necessary, connections with low inductance can be made.

This enables rapid charge transfer between the semiconductor integrated circuit chip 260 and the capacitors 121 mounted on the wiring board, allowing the capacitors 121 to absorb voltage variations that occur when a large amount of high frequency current flows in the semiconductor integrated circuit chip 260, so that malfunctions due to instability of the power supply voltage of the semiconductor integrated circuit chip 260 can be prevented.

While one capacitor 121 is disposed in each of the cavities 120 in the structure of the wiring board described so far, it is possible to dispose a plurality of capacitors 121 by increasing the bottom area of each cavity 120.

For example, by forming the bottom surface of the cavity 120 into the form of a long groove in plan view, a plurality of the capacitors 121 can be aligned.

Referring now to FIG. 3, there is shown a wiring board comprising a build-up layer 130a on a core substrate 110, capacitors 121 provided with electrode terminals on the upper surfaces thereof accommodated within cavities 120 formed in the build-up layer 130a, and a surface conductor layer 130c provided on the upper surfaces of the build-up layer 130a and capacitors 121, the surface conductor layer 130c having a second wiring conductor that is electrically connected to the wiring conductor layers in the build-up layer 130a and the electrode terminals of the capacitors 121.

FIG. 4 shows a semiconductor device comprising the wiring board shown in FIG. 3, in which the semiconductor integrated circuit chip 260 is provided on the surface wiring layer 130c, and the semiconductor integrated circuit chip 260 is electrically connected to the capacitors 121 through the surface wiring layer 130c.

As shown in FIG. 3, the wiring board according to the present invention comprises a core substrate 110, a build-up layer 130a formed on the surface side of the wiring board, a build-up layer 130b formed on the back side of the wiring board, and a surface wiring layer 130c formed on the build-up layer 130a.

The build-up layer 130a comprises a wiring conductor layer 132 (132a, 132b, 132c, 132d) constituting a first wiring conductor and an interlayer insulation layer 131 (131a, 131b, 131c, 131d). The build-up layer 130a is provided with cavities 120 for accommodating the capacitors 121.

The construction of the capacitors 121 is the same as that explained referring to FIGS. 1 and 2, and therefore explanation thereof is not repeated.

The surface wiring layer 130c is provided on the build-up layer 130a and comprises wiring conductor layers 143, 144 constituting a second wiring conductor and interlayer insulation layers 141, 142 alternately stacked on one another.

Via holes are formed in the interlayer insulation layers 131, 141, 142 through which the upper and lower wiring conductor layers are electrically connected to each other. Furthermore, a solder resist layer 151 is formed on the surface wiring layer 130c, which has apertures in which electrode terminals 152 are formed. Solder balls 153 used for connection to the semiconductor integrated circuit chip 260 are formed on the electrode terminals 152.

The capacitors 121 mounted within the cavities 120 in the build-up layer 130a are connected to the wiring conductor layer 132d constituting a first wiring conductor layer of the build-up layer 130a through a second wiring conductor layer 143 in the surface wiring layer 130c. In addition, the capacitors 121 are connected to the electrode terminals 152 through the wiring conductor layer 144 in the surface wiring layer 130c.

Since the construction of a build-up layer 130b on the opposite side of the surface on which the semiconductor integrated circuit chip 260 is mounted is the same as that explained referring to FIGS. 1 and 2, the explanation thereof is not repeated.

FIG. 4 is a cross-sectional view of a semiconductor device fabricated by mounting a semiconductor integrated circuit chip 260 on a wiring board.

In this semiconductor device, electrode terminals 261 of the semiconductor integrated circuit chip 260 and a second wiring conductor layer 144 in a surface wiring layer 130c of the wiring board are electrically connected to each other through electrode terminals 152 and solder balls 153. Since the second wiring conductor layer 144 in the surface wiring layer 130c is connected to capacitors 121 as mentioned before, the electrode terminals 261 of the semiconductor integrated circuit 260 and the capacitors 121 are brought into an electrically connected state.

In the wiring board according to the present invention, the capacitors 121 are disposed in the cavities 120. The cavities 120 are formed to have a larger width than that of the capacitors 121. This is because the machining accuracy for the cavities 120 is lower than the positioning accuracy for mounting the semiconductor integrated circuit chip 260, and the positions of the capacitors 121 needs to be adjusted according to the wiring pattern of the wiring conductor layer 132a on the bottom surface of the cavities 120.

The capacitors 121 can be fixed accurately to the positions within the cavities 120 by applying an adhesive to the bottom surface of the cavities 120 in accordance with the positions of the capacitors 121. Accordingly, it is possible to adjust the positions of the upper electrode terminals of the capacitors 121 to the corresponding positions of the wiring conductor layer 143 accurately.

As described so far, the wiring board according to the present invention allows the electrode terminals of the capacitors 121 to be connected to the semiconductor integrated circuit chip 260 located immediately above the electrode terminals through the surface wiring layer 130c. Accordingly, connections with low resistance and low inductance can be made. This enables rapid charge transfer between the semiconductor integrated circuit chip 260 and the capacitors 121, so that even when a large amount of high frequency current flows in the semiconductor integrated circuit chip 260, the capacitors 121 can absorb the voltage variations. As a result, malfunctions of the semiconductor integrated circuit chip 260 can be prevented.

Moreover, it is made possible to prevent occurrence of contact failure of the capacitors due to insufficient mounting accuracy that has been a significant problem from a practical point of view and to improve the yields in the manufacture of products.

FIG. 5 shows a wiring board comprising a core substrate 110 and a build-up layer 130a provided thereon that includes wiring conductor layers and insulation layers alternately stacked on each other. Capacitors 121 provided with electrode terminals on their upper surfaces are disposed within cavities 120 formed in the build-up layer 130a through an adhesive layer 126 that melted or evaporated by heating.

FIG. 6 shows a state where a semiconductor integrated circuit chip 260 is mounted on upper surfaces of the build-up layer 130a and capacitors 121 of the wiring board.

Figure 7:
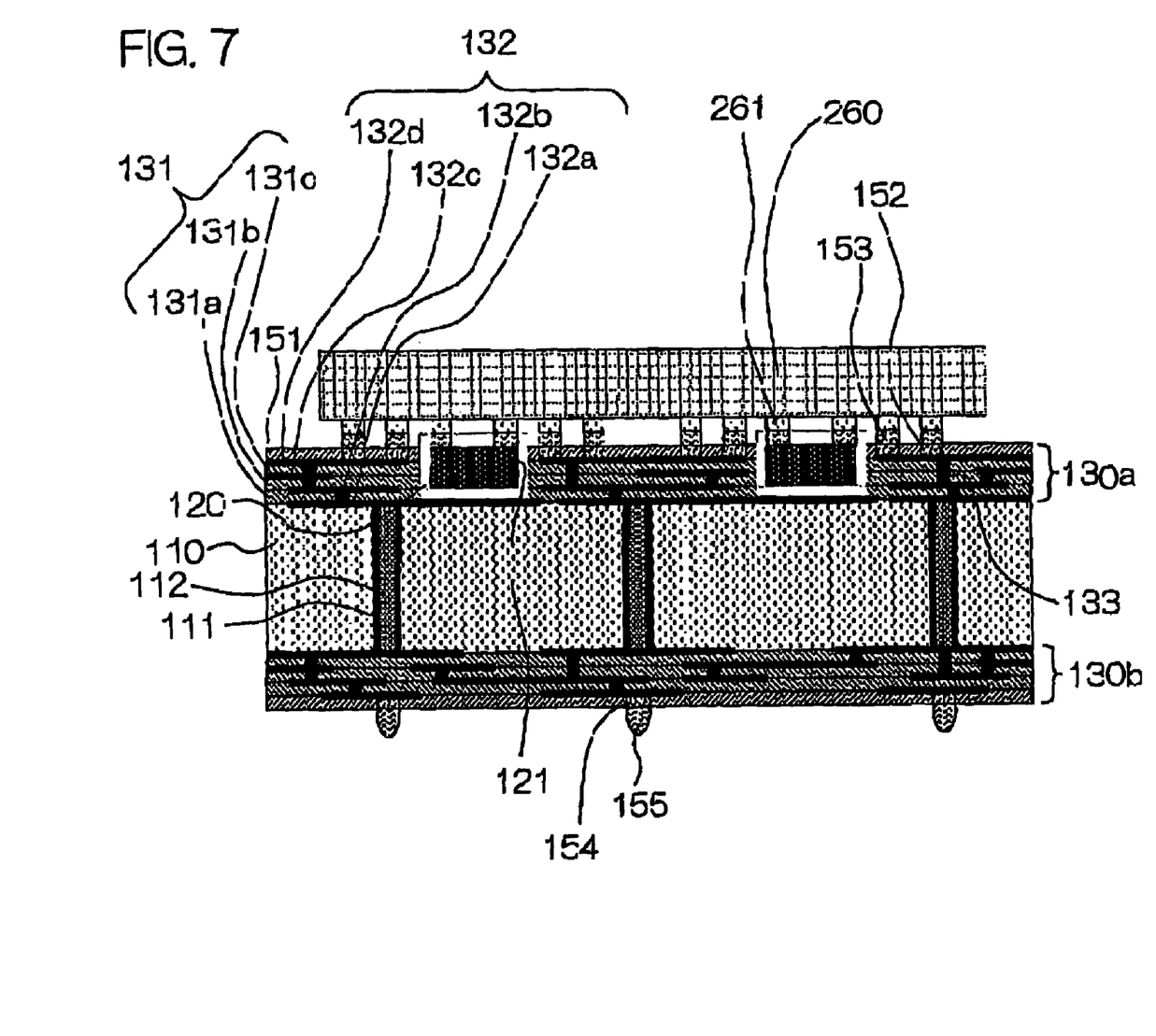
FIG. 7 shows a semiconductor device in which decoupling capacitors 121 are provided inside cavities 120 formed in a build-up layer 130a through an adhesive layer, and a semiconductor integrated circuit chip 260 is mounted thereon. The adhesive layer has disappeared by heating.

FIG. 7 is a cross-sectional view of a semiconductor device where the adhesive layer 126 has disappeared by heating after the mounting of the semiconductor integrated circuit chip 260.

As shown in FIG. 5, the wiring board according to the present invention comprises the core substrate 110, the build-up layer 130a formed on the surface side of the wiring board and a build-up layer 130b formed on the back side of the wiring board. The build-up layer 130a has cavities 120 for accommodating the capacitors 121.

The construction of the build-up layer 130a is the same as that explained referring to FIGS. 1 and 2, and therefore the explanation thereof is not repeated here.

Each capacitor 121 comprises dielectric layers and electrode layers formed in such a manner that they are interposed among the dielectric layers. A couple of electrode terminals drawn from the electrode layers gather on a surface of the capacitor 121 on one side (the upper surface). The capacitor 121 is disposed so that the upper surface having the couple of the electrode terminals faces the opening (the upper surface) of the cavity 120.

In the wiring board according to this embodiment, while one or a plurality of the capacitors 121 are disposed in the cavity 120, the bottom profile of the cavity 120 is designed to be wider than the cross sectional profile of (the bottom of )the capacitor 121 accommodated therein.

A difference between the construction of the wiring board of the present embodiment and those of the wiring board shown in FIGS. 1-4 is that no electrode terminals are present on the back surfaces of the capacitors 121.

Instead, the capacitors 121 are attached by applying an adhesive to the bottom surfaces of the cavities 120 in accordance with the positions of the capacitors 121. The layer formed of the adhesive is referred to as "adhesive layer 126".

The positional accuracy of the capacitors 121 within the cavities 120 at the time of the attachment of the capacitors 121 to the bottom surfaces of the cavities 120 is lower than the accuracy required for mounting the semiconductor integrated circuit chip 260. In the present invention, the low positional accuracy is compensated by the self-alignment effect described later.

FIG. 6 is a cross-sectional view showing a state in which a semiconductor integrated circuit chip 260 is mounted on a wiring board according to the present invention. Electrode terminals 261 provided on the back surface of the semiconductor integrated circuit chip 260 are connected to electrode terminals 152 of the wiring board through solder balls 153. The electrode terminals 261 provided on the back surface of the semiconductor integrated circuit chip 260 are electrically connected to electrode terminals on the upper surfaces of capacitors 121 through solder balls.

The electrode terminals of the capacitors 121 mounted on the wiring board are connected to the electrode terminals of the mounted semiconductor integrated circuit chip 260 with high mounting accuracy owing to the self-alignment during the process of mounting semiconductor integrated circuit chip 260.

Now, this will be described in detail. The capacitors 121 are attached to the bottom surfaces of the cavities 120 by means of an adhesive layer 126 at a time before the mounting of the semiconductor integrated circuit chip 260. In this state, by mounting the semiconductor integrated circuit chip 260 on the wiring board, the electrode terminals 261 of the semiconductor integrated circuit chip 260 are brought into contact with the electrode terminal of the wiring board so that the electrode terminals 261 of the semiconductor integrated circuit chip 260 are brought into contact with the electrode terminals of the capacitors 121. In this state, the positions of the electrode terminals 261 of the semiconductor integrated circuit chip 260 and the electrode terminals of the capacitors 121 are not necessarily coincide with each other accurately.

Subsequently, heating is carried out to melt the solder balls 123 and 153. The adhesive layer 126 is brought into a molten state by this heat, and the capacitors 121 are in a state that allows the capacitors 121 to move in any direction in the horizontal plane. Accordingly, the couple of electrode terminals on the upper surface of each of the capacitors 121 are attracted to positions immediately under the electrode terminals 261 of the semiconductor integrated circuit chip 260 by surface tension of the molten solder 123, by which the positions of the electrode terminals 261 of the semiconductor integrated circuit chip 260 and the electrode terminals of the capacitors 121 are adjusted correctly. As a result, the "self-alignment" is accomplished.

Judging from the discussion above, the adhesive layer 126 needs to be brought into a complete molten liquid state at least at the temperature for the solder reflow carried out when the semiconductor integrated circuit chip 260 is mounted on the wiring board.

Because of the foregoing structure of the semiconductor device, the capacitors 121 can be connected to the semiconductor integrated circuit chip 260 with low resistance and low inductance.

Furthermore, in the process of heating for melting the solder after placing the semiconductor integrated circuit chip 260 on the predetermined position of the wiring board, the capacitors 121 can be connected to the semiconductor integrated circuit chip 260 with accurate positional coincidence. Accordingly, it is possible to prevent the occurrence of contact failure of capacitors due to insufficient mounting accuracy that has been a practically significant problem. In addition, because there is no need for jigs for adjusting the position of the capacitors from outside, it is possible to reduce the mounting cost.

EXAMPLE 1

The wiring board shown in FIGS. 1 and 2 was produced. The production process was as follows.

(1) A glass epoxy resin-impregnated base material was used for the core substrate 110. Prior to the formation of the build-up layer 130a, the core substrate 110 was provided with holes for the through-holes by drilling or laser machining. It is also possible to carry out desmear by a plasma treatment when the need arises.

(2) Subsequently, a copper-plated film was formed on the surface of the core substrate 110 by electroless copper plating. Then, the whole of the core substrate 110 was dipped in the electroless copper plating liquid to further form a copper-plated film using the foregoing copper-plated film as the electrode.

Subsequently, a photosensitive dry film is attached to the surface of the aforementioned copper-plated film, which was then subjected to masked exposure followed by development with an alkali solution so that a resist-plated film with a predetermined pattern was formed.

Then, the whole of the core substrate 110 was dipped in the electroless copper plating liquid to form a copper-plated film using the foregoing copper-plated film as the electrode.

Subsequently, the copper-plated film beneath the resist-plated film was processed by etching with use of a sulfuric acid/hydrogen peroxide mixture for dissolving and removal thereof, thereby forming the wiring conductor layer 132a and the through-hole interior surface wiring layers 111 with predetermined patterns. At the same time, a wiring pattern to which the solder pads 122 of the capacitors 121 are connected later was also formed on the wiring conductor layer 132a. Although a diluted aqueous sodium hydroxide solution was used as the foregoing alkaline solution, other alkaline solutions such as an aqueous solution of potassium hydroxide may be used.

The wiring conductor layer 132a was formed to be thicker than other wiring conductor layers 132 so that it functions as a stopper layer during the laser machining for forming cavities described later.

Meanwhile, any of the wiring conductor layers 132 that are successively formed in later processes may be used as the stopper layer for the laser machining depending on the required depth of the cavities 120. In this case, it should be formed to be thicker than other wiring conductor layers 132 and a wiring pattern to which the solder pads 122 of the capacitors 121 are connected should be formed in any of the wiring conductor layers 132 that is exposed on the bottom surfaces of the cavities 120.

Subsequently, an etch solution was sprayed on the both surfaces of the substrate so as to roughen the surface of the copper film as a wiring conductor layer and the surface of the through-hole 111 lands. Alternatively, a surface roughening treatment with argon plasma may be carried out.

Thereafter, a resin filler composed mainly of an epoxy-based resin was injected into the through-holes 112 and then dried. The resin filler may be a thermosetting resin, thermoplastic resin, UV-hardening resin or the like. However, a thermosetting resin is preferably used because of ease of handling.

(3) Then, the interlayer insulation layer 131a was formed using an epoxy-based resin film that is a thermosetting resin by vacuum welding lamination while raising the temperature.

Subsequently, openings for via holes were formed in the interlayer insulation layer 131a by laser beam cutting with use of a pulsed $CO_2$ gas laser.

Also there is another method for forming the interlayer insulation film 131a, which uses a printer to coat a resin such as a thermosetting resin, thermoplastic resin, photosensitive resin, a composite including a thermosetting resin and a thermoplastic resin, a composite including a photosensitive resin and thermoplastic resin or the like. In addition, instead of laser beam cutting, an exposure and development process can be used for formation of the openings. Also, it is possible to carry out desmear using oxygen plasma when the need arises.

(4) Then formation of a wiring conductor layer was again carried out. First, a copper-plated film was formed on the surface of the interlayer insulation film 131a by electroless copper plating. Instead of the copper film formed by electroless copper plating, a Ni—Cu alloy film deposited by sputtering may also be used. A photosensitive dry film was applied to this film, which is followed by photomask exposure and development with diluted sodium hydroxide to form a resist-plated film. Subsequently, an electroplated copper film with a predetermined pattern was formed by electroplating. After the resist film was peeled off and removed with a diluted sodium hydroxide aqueous solution, the electroplated copper film under the resist film was etched with a sulfuric acid/hydrogen peroxide mixture for dissolving and removal thereof, thereby forming a wiring conductor layer 132b comprising an electroplated copper film.

(5) Subsequently, the interlayer insulation film 131b was formed. In the same way as the formation of the foregoing interlayer insulation film 131a, a thermosetting resin film was used and vacuum welding lamination was carried out while raising the temperature. Then, openings for via holes were formed in the interlayer insulation layer 131b by laser beam radiation.

(6) Thereafter, by repeating the foregoing processes of forming wiring conductor layer and interlayer insulation layer, the wiring conductor layer 132c, interlayer insulation layer 131c, wiring conductor layer 132d and wiring conductor layer 132d were successively formed. Meanwhile, the build-up layer 130a can be formed with any number of layers by repeating this process several number of times.

(7) By radiating the build-up layer 130a produced in this way with laser beams, the cavities 120 for accommodating the capacitors 121 were formed. In this process, the areas of the formed cavities 120 were made larger than the required size by about 50 μm. In determining this, the positioning accuracy and profile accuracy of the laser machining were taken into consideration.

(8) Thereafter, solder electrode terminals (the so-called "ball grid array") were formed with a grid-like pattern on the upper surface of the build-up layer 130a. First, the solder resist layer 151 having openings in the areas corresponding to the solder electrode terminals were formed by screen printing. Alternatively, a process of applying a photosensitive solder resist followed by photomask exposure may be used to accomplish the patterning.

Subsequently, the wiring board was dipped in an electroless nickel plating liquid for 20 minutes to form a nickel-plated film on the openings, and it was further dipped in an electroless gold plating liquid to form a gold-plated film thereon, by which the solder pads 152 were formed.

Thereafter, solder paste was printed on the solder pads 152, and after a reflow process, the solder balls 153 were formed. However, bottom areas of the cavities 120 were not printed with the solder paste.

(9) In the last step, the capacitors 121 were disposed in accordance with the positions of the wiring pattern on the bottom areas of the cavities 120. The capacitors 121 were fixed to and mounted on the wiring board through a reflow process. It is also possible to inject a thermosetting resin into the cavities 120 after the mounting and then heat cure the resin so that the capacitors 121 are completely fixed. However, this thermosetting resin should not cover the upper main surfaces of the capacitors 121 where electrode terminals of the capacitors 121 are present. The thermosetting resin may comprise epoxy resin, phenol resin, polyimide, triazine resin or the like. The thermosetting resin preferably has a thermal expansion coefficient that is a middle value between those of the capacitors 121 and the core substrate 110. In order to adjust the thermal expansion coefficient, using a plurality of resins or impregnation with a filler may be a possible way.

(10) The wiring board according to the present invention was obtained through the steps above.

The wiring board produced as described above allows the capacitors 121 accommodated in the cavities 120 in the build-up layer 130a to be directly connected to the wiring conductor layer 132a on the bottom areas of the cavities 120. Accordingly, the capacitors 121 can be connected to the wiring board with lower resistance and lower inductance than those in the conventional technologies. As a result, when the semiconductor integrated circuit chip 260 was operated continuously at a high frequency, voltage drop in the capacitors, which often occurs in the conventional technologies, was not observed.

EXAMPLE 2

Subsequently, the wiring board shown in FIGS. 3 and 4 was produced. The production process thereof will be described referring to FIGS. 3 and 4. The production steps that are the same as the steps in the example of FIGS. 1 and 2 are omitted as far as possible, and the steps characteristic of the present example 2 are described in detail.

First, the core substrate 110 having holes for through-holes was fabricated as in the example 1. Then, the wiring conductor layer 132a comprising a copper film and the through-hole interior surface wiring layers 111 were formed in the surface of the core substrate 110. Then, the surface of the copper film and the surfaces of the through-hole 111 lands were roughened, and a resin filler was injected into the through-holes 112.

The wiring conductor layer 132a functions also as stopper layer for the laser machining for cavity formation described later. Any of the wiring conductor layers 132 that are hereinafter successively stacked may be used as the stopper layer in accordance with the required depth of the cavities 120.

Subsequently, the interlayer insulation layer 131a, the wiring conductor layer 132b, the interlayer insulation layer 131b, the wiring conductor layer 132c, interlayer insulation layer 131c, wiring conductor layer 132d were alternately and successively formed.

The build-up layer 130a comprising the interlayer insulation layers 131 and wiring conductor layers 132 formed in the foregoing way was provided with the cavities 120 for accommodating the capacitors 121 by laser machining. In this step, the areas of the cavities 120 formed were made larger than the required size by about 50 μm.

Thereafter, an adhesive was applied using a printer to the positions on the bottom surfaces of the cavities where the capacitors 121 were to be disposed. Meanwhile, instead of the application of the adhesive, potting may be carried out. The thermal expansion coefficient of the adhesive is preferably at a middle value between those of the capacitors 121 and core substrate 110.

Subsequently, the capacitors 121 were disposed on and fixed to the positions in the bottom surfaces of the cavities 120 to which the adhesive was applied.

Thereafter, gaps between the capacitors 121 and cavities 120 were filled with a thermosetting resin, which was heat cured so that the capacitors 121 were completely fixed. Here, the application of thermosetting resin was intended not to cover the surfaces where the electrode terminals of the capacitors 121 were present. The thermosetting resin preferably comprises epoxy resin, phenol resin, polyimide, triazine resin or the like. Preferably, the thermosetting resin has a thermal expansion coefficient that is a middle value between those of the capacitors 121 and the core substrate 110. In order to adjust the thermal expansion coefficient, using a plurality of resins or impregnation with a filler may be a possible way.

Then, with the capacitors 121 fixed to the cavities 120, the interlayer insulation layer 141 was formed on the wiring conductor layer 132d. By the same formation process as described above, the interlayer insulation layer 141 was formed by vacuum welding lamination using an epoxy-based resin film that is a thermosetting resin while raising the temperature. Openings for via holes for connection to the wiring conductor layer 132d were provided at the predetermined positions in the interlayer insulation layer 141.

Subsequently, the wiring conductor layer 143 for connecting the electrode terminals of the capacitors 121 to conduction circuits of the build-up layer 130a was formed over the interlayer insulation layer. Then, the interlayer insulation layer 142 and the wiring conductor layer 144 were successively formed. The wiring conductor layer 144 is the layer for providing connection bumps for mounting the semiconductor integrated circuit chip 260.

Through the steps above, the surface wiring layer 130c was fabricated.

Subsequently, solder electrode terminals (the so-called "ball grid array") were formed with a grid-like pattern on the surface wiring layer 130c. First, the solder resist layer 151 was formed by screen printing. Alternatively, a process of applying a photosensitive solder resist followed by photomask exposure may be used to accomplish the patterning. Subsequently, the wiring board was dipped in an electroless nickel plating liquid for 20 minutes to form a nickel-plated film on the opening areas of the solder resist layer 151, and it was further dipped in an electroless gold plating liquid to form a gold-plated film thereon, by which the solder pads 152 were formed.

In the following step, solder paste was printed on the solder pads 152, and after a reflow process, the solder balls 153 were formed.

The wiring conductor layer 143 enables the electrode terminals of the capacitors 121 to be connected to the wiring conductor layer 132d of the build-up layer 130a with low resistance and low inductance, and enables rapid charge transfer to the capacitors 121.

The wiring conductor layer 144 is connected to the electrode terminals of the capacitors 121 with low resistance and low inductance, and electric charges are supplied from the capacitors 121 to the semiconductor integrated circuit chip 260 through the solder balls 153 in a low resistance and low inductance condition.

The wiring pattern for laying out the solder bumps 152 of the foregoing wiring conductor layer 144 has high accuracy and a narrow pitch. On the other hand, the wiring pattern for laying out the wiring conductor layer 143 connected to the electrode terminals of the capacitors 121 has a wide pitch and takes a large area for the connection areas. The reason for the difference in pitch and size between the wiring patterns is as follows: despite the requirement for high accuracy for mounting the semiconductor integrated circuit chip 260, since the capacitors 121 are disposed with low positional accuracy as described above, the connection areas are widely designed for anticipated positional differences so that the connections are not misaligned.

The wiring board produced in this way had resistance and inductance as low as those in the prior art, and contact failure of the capacitors after the mounting of the semiconductor integrated circuit chip 260, which often occurs to the wiring boards in the conventional technologies, was not observed in the wiring board of the present invention. In addition, even when the semiconductor integrated circuit chip 260 was continuously operated at a high speed, voltage drop of the capacitors, which often occurs in the conventional technologies, was not observed.

EXAMPLE 3

Subsequently, the wiring board shown in FIGS. 5, 6 and 7 was produced. The production process thereof will be described. The production steps that are the same as the steps in the example of FIGS. 1 to 4 are omitted as far as possible, and the steps characteristic of the present example 3 are described in detail.

Referring to FIG. 5, the core substrate 110 having holes for through-holes was fabricated. Then, the wiring conductor layer 132a comprising a copper film formed on the surface of the core substrate 110 and the through-hole interior surface wiring layers 111 were formed. Then, the surface of the copper film and the surfaces of the through-hole lands were roughened, and a resin filler was injected into the through-holes 112.

The wiring conductor layer 132a functions also as stopper layer during the laser machining for cavity formation as described later. Any of the wiring conductor layers 132 that are hereinafter successively stacked may be used as the stopper layer in accordance with the required depth of the cavities 120.

Subsequently, the interlayer insulation layer 131a, the wiring conductor layer 132b, the interlayer insulation layer 131b, the wiring conductor layer 132c, interlayer insulation layer 131c, wiring conductor layer 132d were successively formed.

The build-up layer 130a comprising the interlayer insulation layers 131 and wiring conductor layers 132 formed in the foregoing way was provided with the cavities 120 for accommodating the capacitors 121 by laser machining. In this step, the areas for forming the cavities 120 were made larger than the required size by about 50 µm. In determining this, the positioning accuracy and profile accuracy of the laser machining were taken into consideration.

Thereafter, an adhesive was applied using a printer in accordance with the positions of the capacitors 121 in the bottom surfaces of the cavities 120. Meanwhile, instead of the application of the adhesive, potting may be carried out.

The adhesive material used was POM (Polyoxymethylene).

The adhesive material needs to be in a solid state at the peak temperature of heating in the reliability test after the production of this wiring board, and in a completely molten state at the peak temperature in the solder reflow process carried out when the semiconductor integrated circuit chip 260 is mounted on this wiring board. In addition, the melting point of the adhesive material is preferably lower than the solidification temperature of the solder in order to accomplish good self-alignment. Since the melting point of POM is 181° C. and the melting point of the solder is 220° C., the foregoing conditions are satisfied. Polypropylene (PP) having a melting point of 180° C. may also be used as the material.

After the formation of the adhesive layer 126, the wiring board was heated to 200° C. to melt the adhesive layer 126, and then the capacitors 121 were disposed at the positions in the bottom surfaces of the cavities 120 to which the adhesive material was applied. Then, the temperature was gradually lowered to room temperature so that the capacitors 121 were once fixed to the bottom surfaces of the cavities 120.

Thereafter, a solder resist layer 151 having solder pads 152 was formed on the wiring conductor layer 132d, and the solder balls 153 were deposited on the solder pads 152.

Then, the semiconductor integrated circuit chip 260 was placed on the wiring board produced in the foregoing manner, and the solder was melted by reflow, thereby mounting the semiconductor integrated circuit chip 260 on the wiring board. The peak temperature for the reflow during the mounting was 260° C.

Twenty four samples of semiconductor devices were fabricated in the above described way, and electric properties between the capacitors 121 and the semiconductor integrated circuit chip 260 were measured. The electric properties are the kind that can be obtained by measuring the power supply voltage applied to the semiconductor integrated circuit chip 260 and the load current flowing into the loads that are connected to the semiconductor integrated circuit chip 260.

As for the resistance and inductance characteristics, the measured resistance and inductance were both as low as those in conventional technologies that have a structure comprising chip capacitors embedded in cavities formed on a surface of a wiring board for accommodating a semiconductor chip.

In addition, contact failure of capacitors 121 after the mounting of a semiconductor integrated circuit chip, which was often seen in conventional technologies, was not observed in the wiring board of the present invention.

This shows that the semiconductor integrated circuit chip 260 and the capacitors 121 are completely electrically connected in the wiring board of the present invention.

Furthermore, a wiring board in which 2,3-xylenol was used as another material for the adhesive layer 126 was produced.

After the adhesive layer 126 was formed on the bottom surfaces of the cavities 120, it was heated to 90° C., and then the capacitors 121 were placed at the positions in the bottom surfaces of the cavities 120 to which the adhesive material was applied. Then the temperature was gradually lowered to room temperature so that the capacitors 121 were cooled and fixed. The reason for the heating temperature lower than that in the case of POM is that the melting point of 2,3-xylenol is 75° C. In the case where 2,3-xylenol was used, because of the boiling point 218° C. of 2,3-xylenol, 2,3-xylenol gradually evaporated during the solder reflow (the peak temperature during the solder reflow was 260° C.), and after the solder was solidified, the adhesive layer 126 completely disappeared.

The state where 2,3-xylenol disappeared is shown in FIG. 7. In this case, more complete self-alignment can be accomplished than in the case of FIG. 6.

As other adhesive materials, isomers such as 2,5-xylenol (melting point: 75° C., boiling point: 210° C.), 3,4-xylenol (melting point: 65° C., boiling point: 225° C.), 3,5-xylenol (melting point: 65° C., boiling point: 220° C.) and mixtures thereof may be used.

When the samples were checked after the mounting of the semiconductor integrated circuit chip 260, the adhesive layer disappeared in all of the 24 samples.

Measurements of the electric properties revealed that the samples showed resistances and inductances as low as those in conventional technologies that have a structure comprising chip capacitors embedded in cavities formed on a surface of a wiring board for accommodating a semiconductor chip.

In addition, contact failure of capacitors after the mounting of a semiconductor integrated circuit chip, which was often seen in conventional technologies, was not observed in the wiring board of the present invention. Accordingly, it seemed that the mounting of the capacitors 121 of this example was accomplished also by self-alignment.

What is claimed is:

1. A wiring board comprising:
   a core substrate;
   a build-up layer formed on at least one side of main surfaces of the core substrate, which comprises wiring conductor layers and insulation layers alternately stacked on each other; and
   a capacitor disposed in a cavity that is formed within the build-up layer, wherein the capacitor is above the core substrate, wherein the core substrate serves as a base of the build-up layer;
   wherein the capacitor has electrode terminals on an upper surface thereof and a back surface of the capacitor has a connection portion that is connected to one of the wiring conductor layers on a bottom surface of the cavity.

2. The wiring board according to claim 1, wherein the upper end of the electrode terminals on the upper surface of the capacitor is flush with the upper end of installation electrode terminals provided on the build-up layer for mounting a semiconductor component.

3. The wiring board according to claim 1, wherein the connection portion comprises electrode terminals provided on the back surface of the capacitor.

4. A semiconductor device comprising a wiring board and a semiconductor component mounted on the wiring board, the wiring board comprising:
   a core substrate,
   a build-up layer formed on at least one side of main surfaces of the core substrate, which comprises wiring conductor layers and insulation layers alternately stacked on each other,
   and a capacitor disposed in a cavity that is formed within the build-up layer, wherein the capacitor is above the core substrate, wherein the core substrate serves as a base of the build-up layer, wherein the capacitor has electrode terminals on an upper surface thereof,
   the upper ends of the electrode terminals of the capacitor are made flush with the upper ends of installation electrode terminals provided on the build-up layer for mounting a semiconductor component,
   and the semiconductor component is connected to the installation electrode terminals of the build-up layer and the electrode terminals of the capacitor.

5. The semiconductor device according to claim 4, further comprising a connection portion interposed between a back surface of the capacitor and one of the wiring conductor layers on a bottom surface of the cavity, the connection portion comprising electrode terminals provided on the back surface of the capacitor.

6. The semiconductor device according to claim 4, wherein a space is present between a back surface of the capacitor and one of the wiring conductor layers on a bottom surface of the cavity.

7. A wiring board comprising:
   a core substrate;
   a build-up layer formed on at least one side of main surfaces of the core substrate, which comprises wiring conductor layers and insulation layers alternately stacked on each other; and
   a capacitor disposed in a cavity that is formed within the build-up layer, wherein the core substrate serves as a base of the built-up layer;
   wherein the capacitor has electrode terminals on an upper surface thereof, and a back surface of the capacitor has a connection portion that is directly connected to the wiring conductor layer on a bottom surface of the cavity.

8. The wiring board according to claim 7, wherein the wiring conductor layer on the bottom surface of the cavity is formed on the core substrate.

9. The wiring board according to claim 7, wherein the wiring conductor layer on the bottom surface of the cavity is formed to be thicker than other wiring conductor layers.

10. A semiconductor device comprising a wiring board and a semiconductor component mounted on the wiring board, the board comprising:
    a core substrate;
    a build-up layer formed on at least one side of main surfaces of the core substrate, which comprises wiring conductor layers and insulation layers alternately stacked on each other,
    and a capacitor disposed in a cavity that is formed within the build-up layer, wherein the core substrate serves as a base of the build-up layer,
    wherein the capacitor has electrode terminals on an upper surface thereof and a back surface of the capacitor has a connection portion that is directly connected to the wiring conductor layer on a bottom surface of the cavity,
    the upper ends of the electrode terminals of the capacitor are made flush with the upper ends of installation electrode terminals provided on the build-up layer for mounting a semiconductor component,
    and the semiconductor component is connected to the installation electrode terminals of the build-up layer and the electrode terminals of the capacitor.

* * * * *